United States Patent
Lu et al.

(10) Patent No.: US 11,102,905 B2
(45) Date of Patent: Aug. 24, 2021

(54) STRUCTURE FOR MOUNTING SERVERS, SUBASSEMBLY FOR RAPID DISASSEMBLY, AND SERVER CABINET WITH THE SUBASSEMBLY

(71) Applicant: HONGFUJIN PRECISION ELECTRONICS (TIANJIN) CO., LTD., Tianjin (CN)

(72) Inventors: Hsueh-Chin Lu, New Taipei (TW); Hung-Liang Chung, New Taipei (TW); Ti-An Tsai, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/397,499

(22) Filed: Apr. 29, 2019

(65) Prior Publication Data

US 2020/0077533 A1    Mar. 5, 2020

(30) Foreign Application Priority Data

Aug. 31, 2018 (CN) .......................... 201811014384.7

(51) Int. Cl.
*H05K 7/18* (2006.01)
*H05K 7/14* (2006.01)

(52) U.S. Cl.
CPC ......... *H05K 7/1489* (2013.01); *H05K 7/1488* (2013.01); *H05K 7/183* (2013.01)

(58) Field of Classification Search
CPC .... H05K 7/1489; H05K 7/183; H05K 7/1488; A47B 96/06; A47B 96/14
See application file for complete search history.

(56) References Cited

U.S. PATENT DOCUMENTS

| 7,293,666 B2 * | 11/2007 | Mattlin ................. G06F 1/181 |
| | | 211/189 |
| 8,955,927 B2 * | 2/2015 | Fritz ..................... A47B 96/14 |
| | | 312/257.1 |

(Continued)

FOREIGN PATENT DOCUMENTS

| CN | 201199761 Y | 2/2009 |
| CN | 202750380 U | 2/2013 |

(Continued)

*Primary Examiner* — Kimberley S Wright
(74) *Attorney, Agent, or Firm* — ScienBiziP, P.C.

(57) ABSTRACT

A structure for mounting servers includes at least one cross beam, at least one mounting column, and at least one fastening subassembly. A guide rail is fixed on each of the cross beam and extends along the cross beam. A first space is formed by the guide rail and the cross beam. The mounting column is connected to the cross beam by the fastening subassembly. The mounting column is perpendicularly connected to the cross beam by the fastening subassembly. The fastening subassembly comprises a first fastener which comprises a thumb screw and an extrusion subassembly. The extrusion subassembly is located in the first space and capable of moving back and forth along the cross beam. The thumb screw passes through the mounting column, enters into the first space, and matches with the extrusion subassembly to tighten the cross beam and the mounting column.

11 Claims, 9 Drawing Sheets

(56) References Cited

U.S. PATENT DOCUMENTS

| | | | | |
|---|---|---|---|---|
| 2002/0046979 A1* | 4/2002 | Larsen | .................. | H05K 7/183 |
| | | | | 211/26 |
| 2003/0034717 A1* | 2/2003 | Yao | ........................ | G06F 1/183 |
| | | | | 312/223.1 |
| 2007/0257169 A1* | 11/2007 | Taggett | .................. | A47B 96/06 |
| | | | | 248/220.41 |
| 2010/0110621 A1* | 5/2010 | Dunn | .................... | H05K 7/1488 |
| | | | | 361/679.01 |
| 2011/0304244 A1* | 12/2011 | Cottuli | ................ | H05K 7/1488 |
| | | | | 312/223.1 |
| 2012/0025683 A1* | 2/2012 | Mattlin | ................ | H05K 5/0226 |
| | | | | 312/326 |
| 2012/0292278 A1* | 11/2012 | Schluter | ............... | H05K 7/1489 |
| | | | | 211/183 |
| 2017/0223864 A1* | 8/2017 | Jost | ...................... | H05K 7/1401 |

FOREIGN PATENT DOCUMENTS

| | | |
|---|---|---|
| CN | 106764293 A | 5/2017 |
| TW | 201134346 A | 10/2011 |

* cited by examiner

STRUCTURE FOR MOUNTING SERVERS, SUBASSEMBLY FOR RAPID DISASSEMBLY, AND SERVER CABINET WITH THE SUBASSEMBLY

FIELD

The subject matter of the application generally relates to structures of server cabinet.

BACKGROUND

A cabinet used for holding servers is usually made of metal. The cabinet can protect the servers, shield against electromagnetic interference, arrange the servers orderly and neatly, and facilitate maintenance of the servers.

Cabinets capable of storing servers of different sizes are needed, so a standard distance between mounting columns of the cabinet should be adjustable. However, the s mounting columns are usually secured with screws. Servers secured by screws may be inconvenient for disassembling, and if need to adjust the distance between mounting column, it may be time consuming.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
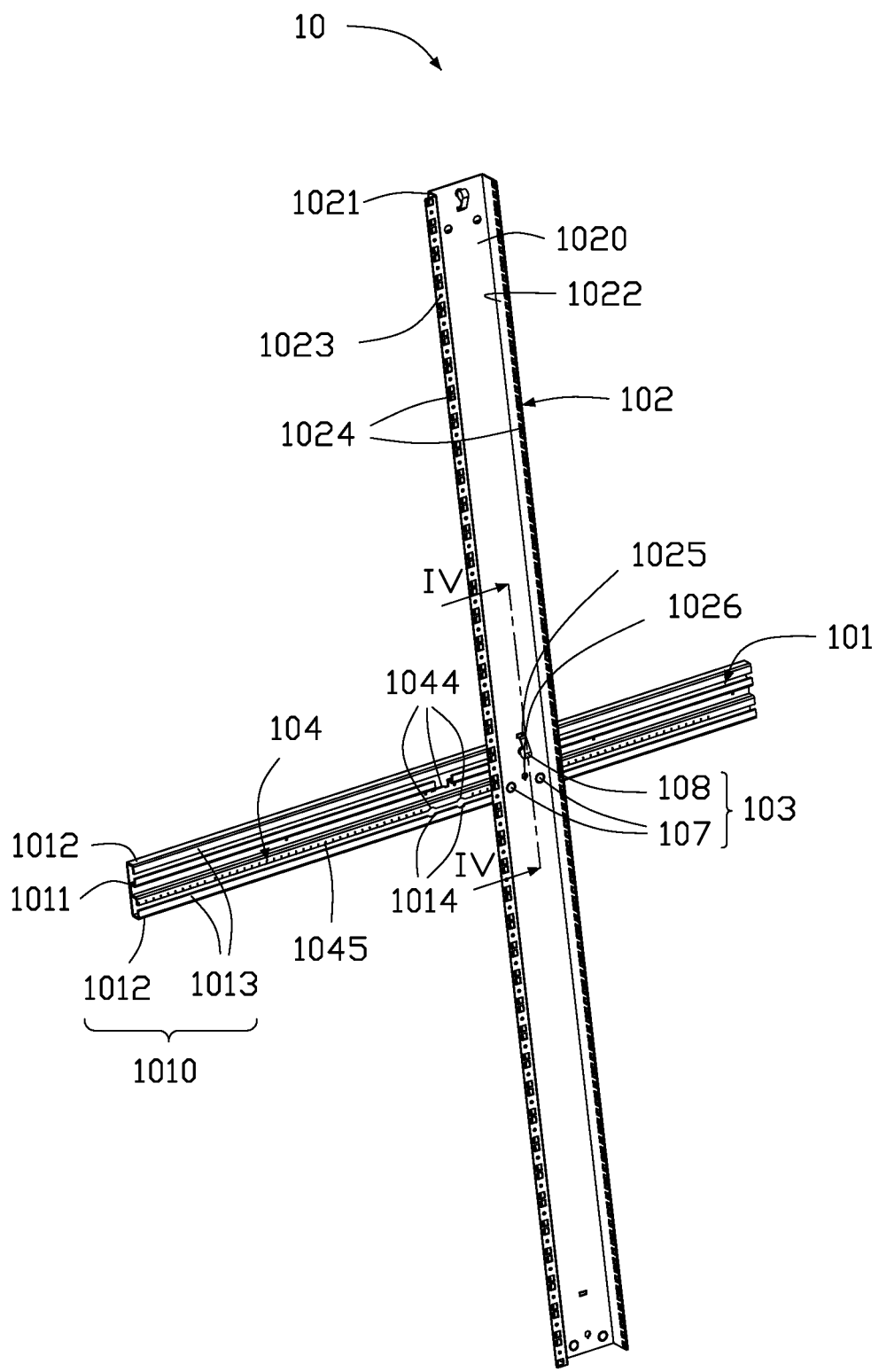
FIG. 1 is a perspective view of a first embodiment of a structure for mounting servers according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIGS. 1-6 show a structure for mounting servers 10, in the present disclosure. The first structure for mounting servers 10 includes at least one cross beam 101, at least one mounting column 102, and at least one fastening subassembly 103. The mounting column 102 is connected to the cross beam 101 by the fastening subassembly 103. In at least one embodiment, the middle part of the mounting column 102 is perpendicularly connected to the cross beam 101 by the fastening subassembly 103. In this paragraph, the middle part of the mounting column 102 refers to the part between the two ends of the mounting column 102.

Figure 3:
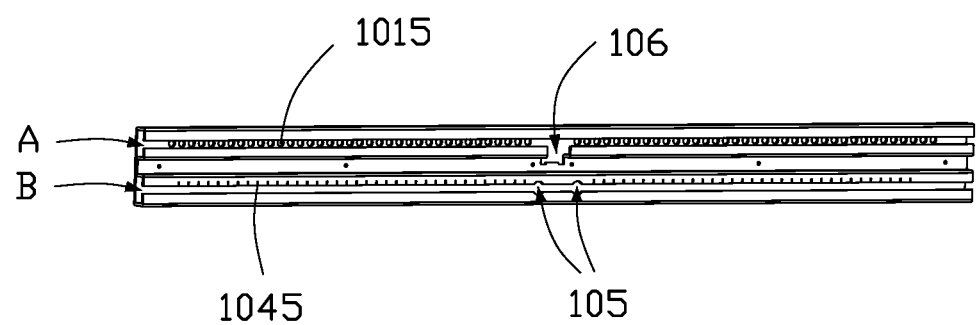
FIG. 3 is a perspective view of a cross beam and a guide rail of the structure for mounting servers of FIG. 1

The cross beam 101 is a "C"-shaped structure having two side edges 1010 and a cross beam bottom 1011. Each of the two side edges 1010 includes a first side edge portion 1012 perpendicularly connected to the cross beam bottom 1011 and a second side edge portion 1013 perpendicularly extending from the first side edge portion 1012. The second side edge portions 1013 of the two side edges 1010 extend face to face. A plurality of first passage holes 1014 is defined in the second side edge portions 1013. Referring to FIG. 3, first location holes 1015 are defined in the cross beam bottom 1011.

A guide rail 104 is fixed on the cross beam bottom 1011. The guide rail 104 extends along the cross beam 101. The guide rail 104 is between the two side edges 1010. The guide rail 104 includes two side walls 1040 and a rail bottom 1041. Each of the two side walls 1040 includes a first side wall portion 1042 perpendicularly connected to the rail bottom 1041 and a second side wall portion 1043 perpendicularly extending out from the first side wall portion 1042. The second side wall portions 1043 extend in opposite directions. A plurality of second passage holes 1044 is defined in the second side wall portions 1043. The plurality of second passage holes 1044 matches the plurality of first passage holes 1014. Tick marks 1045 are engraved on the second side wall portions 1043. The tick marks 1045 are uniformly engraved on the second side wall portions 1043. The tick marks 1045 facilitate estimation of distances by the customer.

A first space "A" is formed by one of the two side edges 1010, the cross beam bottom 1011, and one of the two side walls 1040. A second space "B" is formed by the other one of the two side edges 1010, the cross beam bottom 1011, and the other one of the two side walls 1040.

In the second space "B", two first imports and exports 105 are formed by the plurality of first passage holes 1014 and the plurality of second passage holes 1044. In the first space "A", a second import and export 106 of a shape different to that of a first import and export 105 is formed by part of the plurality of second passage holes 1044.

The mounting column 102 is a strip structure and has a cross section that is grooved. The mounting column 102 includes a column bottom 1020, a first column side edge 1021 perpendicularly connected to the column bottom 1020, a second column side edge 1022 perpendicularly connected to the column bottom 1020, and a third column side edge 1023 perpendicularly extending out from the first column side edge 1021. The second column side edge 1022 faces the first column side edge 1021. A plurality of apertures 1024 is defined in the second column side edge 1022 and the third column side edge 1023. The plurality of apertures 1024 are used for mounting servers (not shown).

A second location hole 1025 is defined in the column bottom 1020. An observation well 1026 is defined in the column bottom 1020. At least one tick mark 1045 is exposed from the observation well 1026. The user can estimate the precise location of the mounting column 102 by observing the tick mark 1045 from the observation well 1026.

Figure 4:
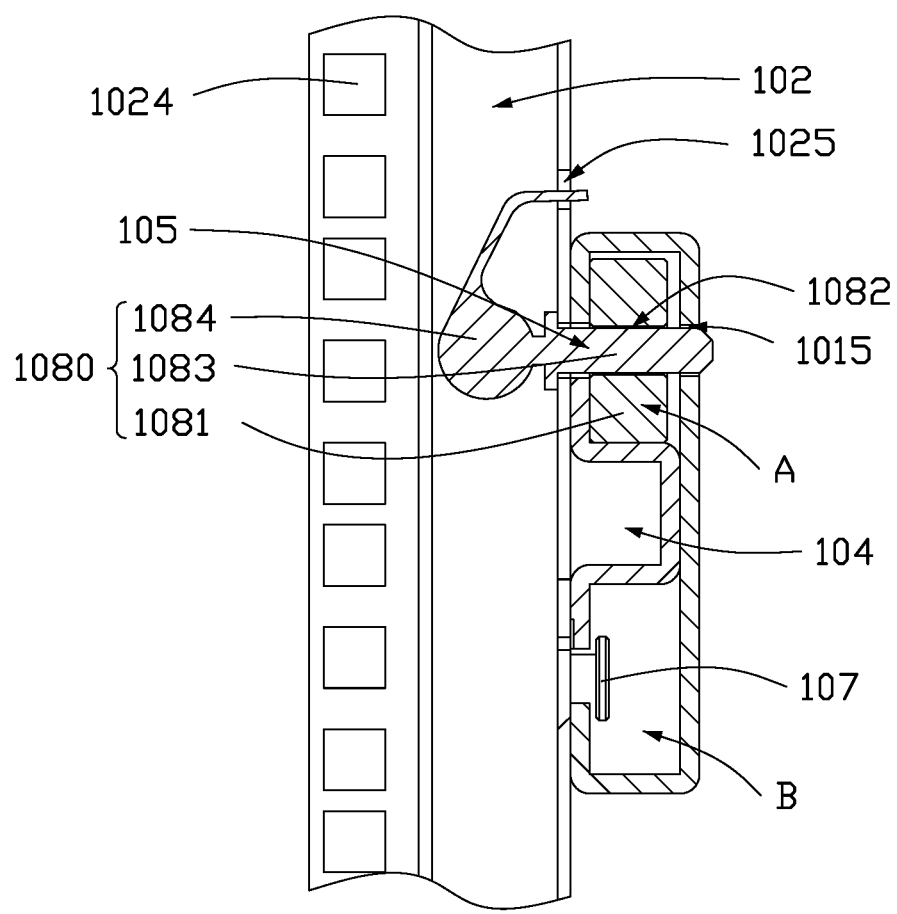
FIG. 4 is a cross-section view along line IV-IV of FIG. 1.
Figure 5:
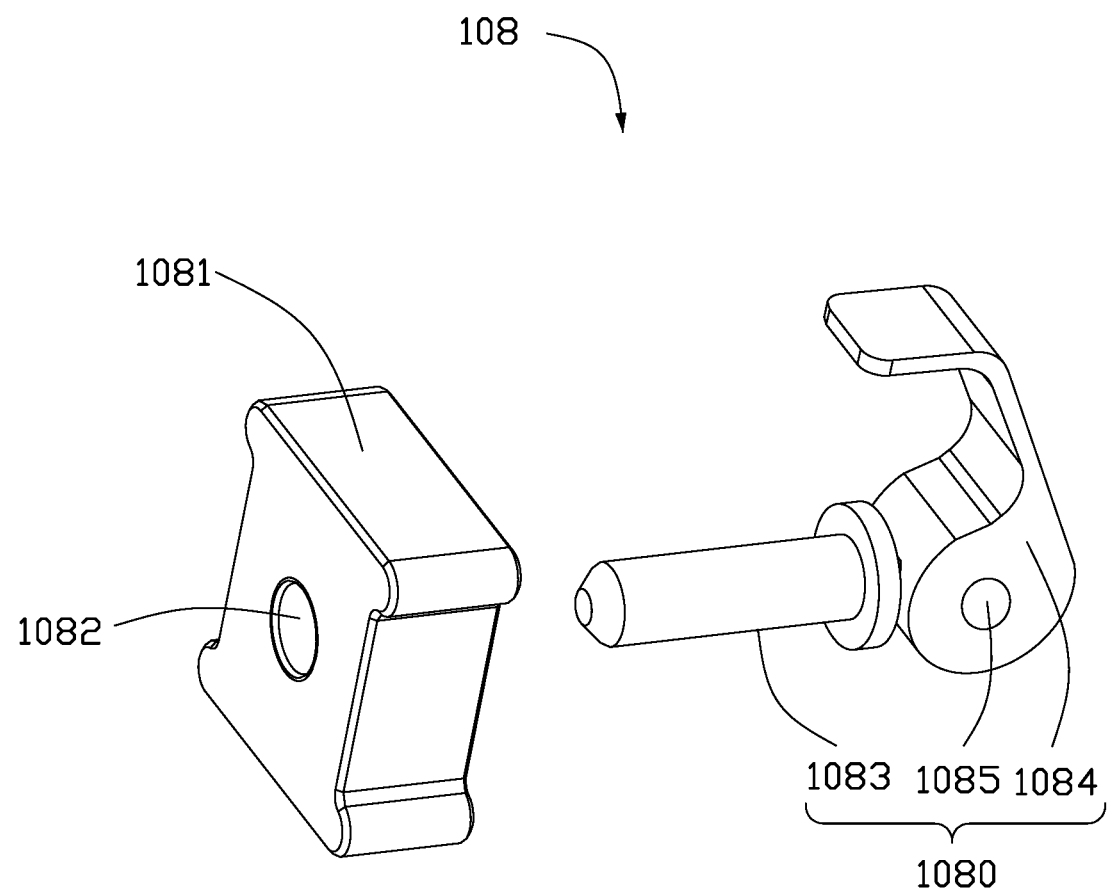
FIG. 5 is a perspective view of a second fastener of the structure for mounting servers of FIG. 1.
Figure 6:
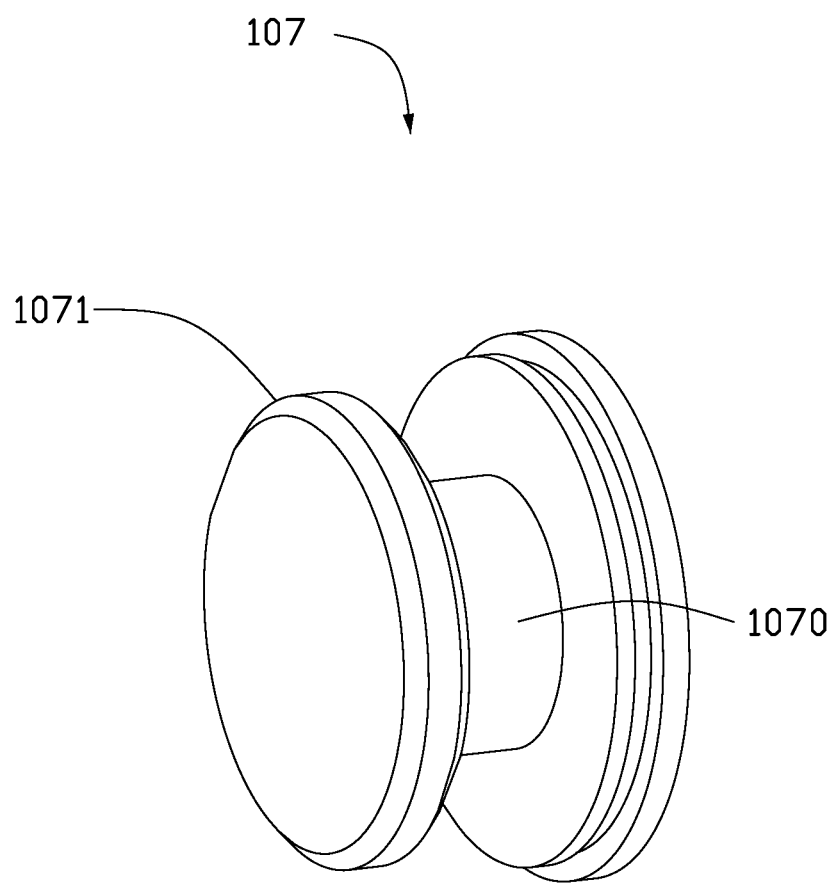
FIG. 6 is a perspective view of a guide pin of the structure for mounting servers of FIG. 1.

Referring to FIGS. 4-6, the fastening subassembly 103 includes two second fasteners 107 and a first fastener 108.

Figure 2:
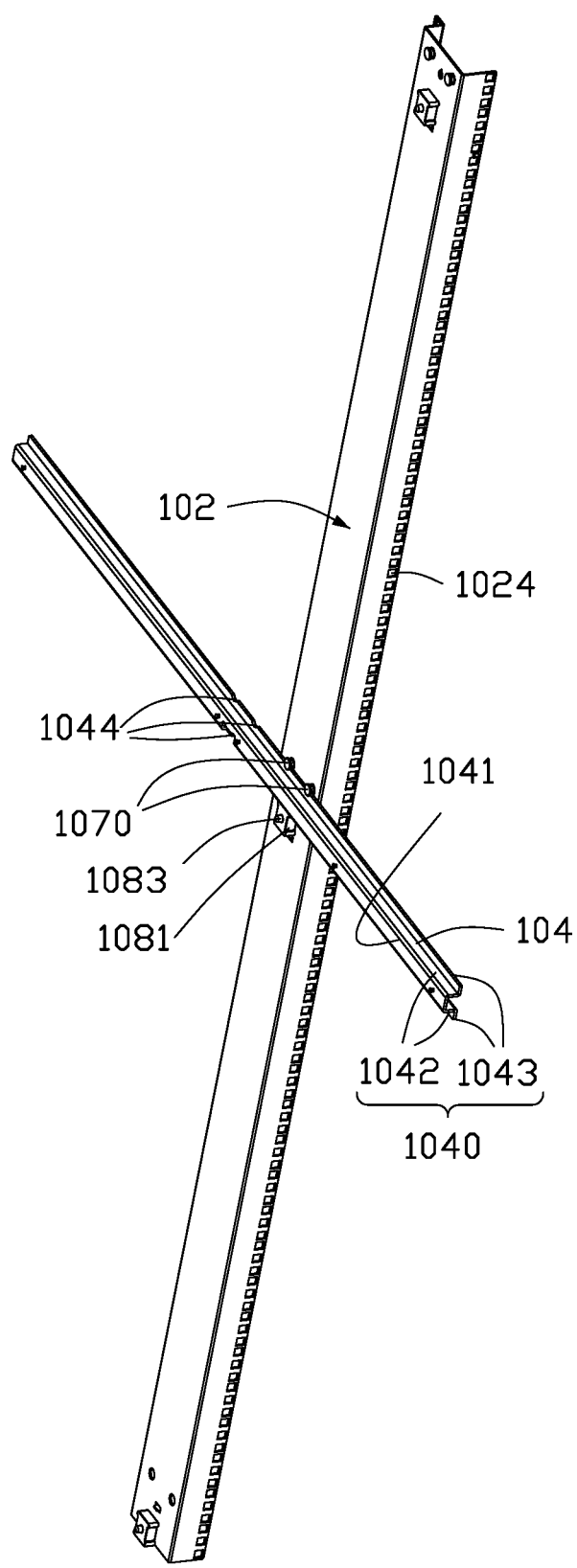
FIG. 2 is a perspective view of the structure for mounting servers of FIG. 1 from another angle, without a cross beam.

The second fastener 107 includes a guide subassembly 1070 (shown in FIG. 2). One end of the guide subassembly 1070 is fixed on the column bottom 1020, and the other end of the guide subassembly 1070 extends out to form a cap-like protrusion 1071. The cap-like protrusion 1071 enters into the second space "B" through the first import and export 105. The mounting column 102 can be moved back and forth along the cross beam 101 by the guide subassembly 1070.

The first fastener 108 includes a thumb screw 1080 and an extrusion subassembly 1081. A through hole 1082 is defined in the extrusion subassembly 1081. The through hole 1082 has internal threads (not shown). The thumb screw 1080 passes through the mounting column 102, enters into the first space "A", and matches with the extrusion subassembly 1081 to tighten together the cross beam 101 and the mounting column 102. The extrusion subassembly 1081 enters into the first space "A" through the second import and export 106. The extrusion subassembly 1081 can be moved back and forth along the cross beam 101 in the first space "A".

The thumb screw 1080 includes a threaded rod 1083 and a handle 1084. The handle 1084 is movably connected with the threaded rod 1083. The threaded rod 1083 has external thread (not shown) matching with the internal threads. The handle 1084 is used to rotate the thumb screw 1080. The threaded rod 1083 is received in the through hole 1082 to match with the extrusion subassembly 1081 and connect the mounting column 102 to the cross beam 101.

The handle 1084 is movably connected with the threaded rod 1083 by a stud 1085.

After the thumb screw 1080 is tightened, one end of the handle 1084 away from the threaded rod 1083 is pushed into the second location hole 1025 to avoid an accidental loosening. After the threaded rod 1083 passes through the through hole 1082 and protrudes from the extrusion subassembly 1081, the threaded rod 1083 in the first location holes 1015 prevents the threaded rod 1083 from moving along the second space "B".

Steps for assembling the first structure for mounting servers 10 are that, first, the mounting column 102 is fixed on the middle portion of the cross beam 101 by the second fastener 107. Second, the mounting column 102 and the cross beam 101 are clamped together by the thumb screw 1080 and the extrusion subassembly 1081.

Steps for disassembling the first structure for mounting servers 10 are the reverse of the steps for assembling the first structure for mounting servers 10. First, the thumb screw 1080 is unscrewed and second, the second fastener 107 is taken out from the cross beam 101, the mounting column 102 and the cross beam 101 are thus separated.

Figure 7:
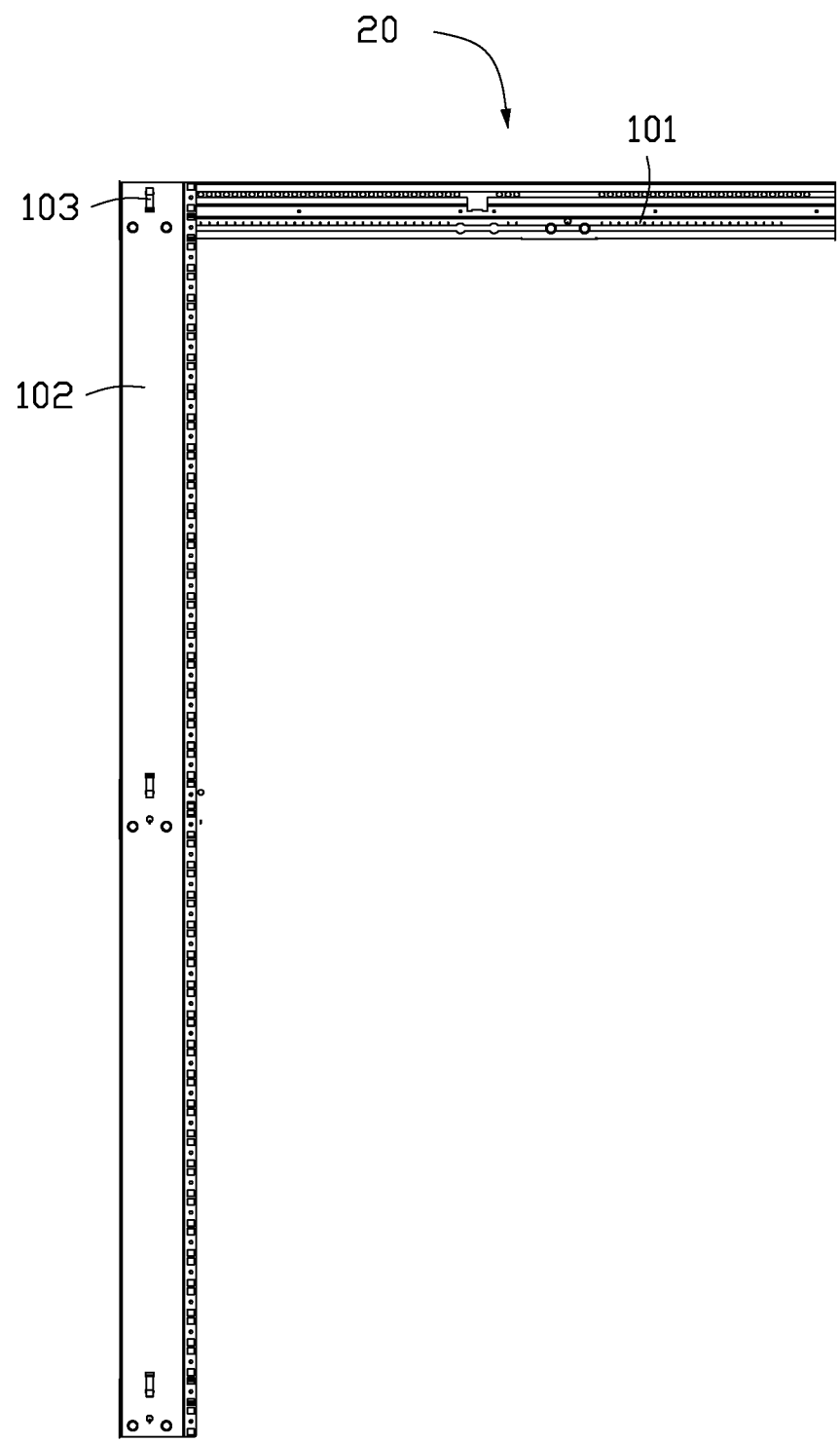
FIG. 7 is a perspective view of a second embodiment of a structure for mounting servers.

FIG. 7 shows a structure for mounting servers 20. The difference from the first structure for mounting servers 10 is that, the second fastener 107 pre-fixes a top end of the mounting column 102 to one top end of the cross beam 101, then the mounting column 102 and the cross beam 101 are clamped together by the thumb screw 1080 and the extrusion subassembly 1081.

Figure 8:
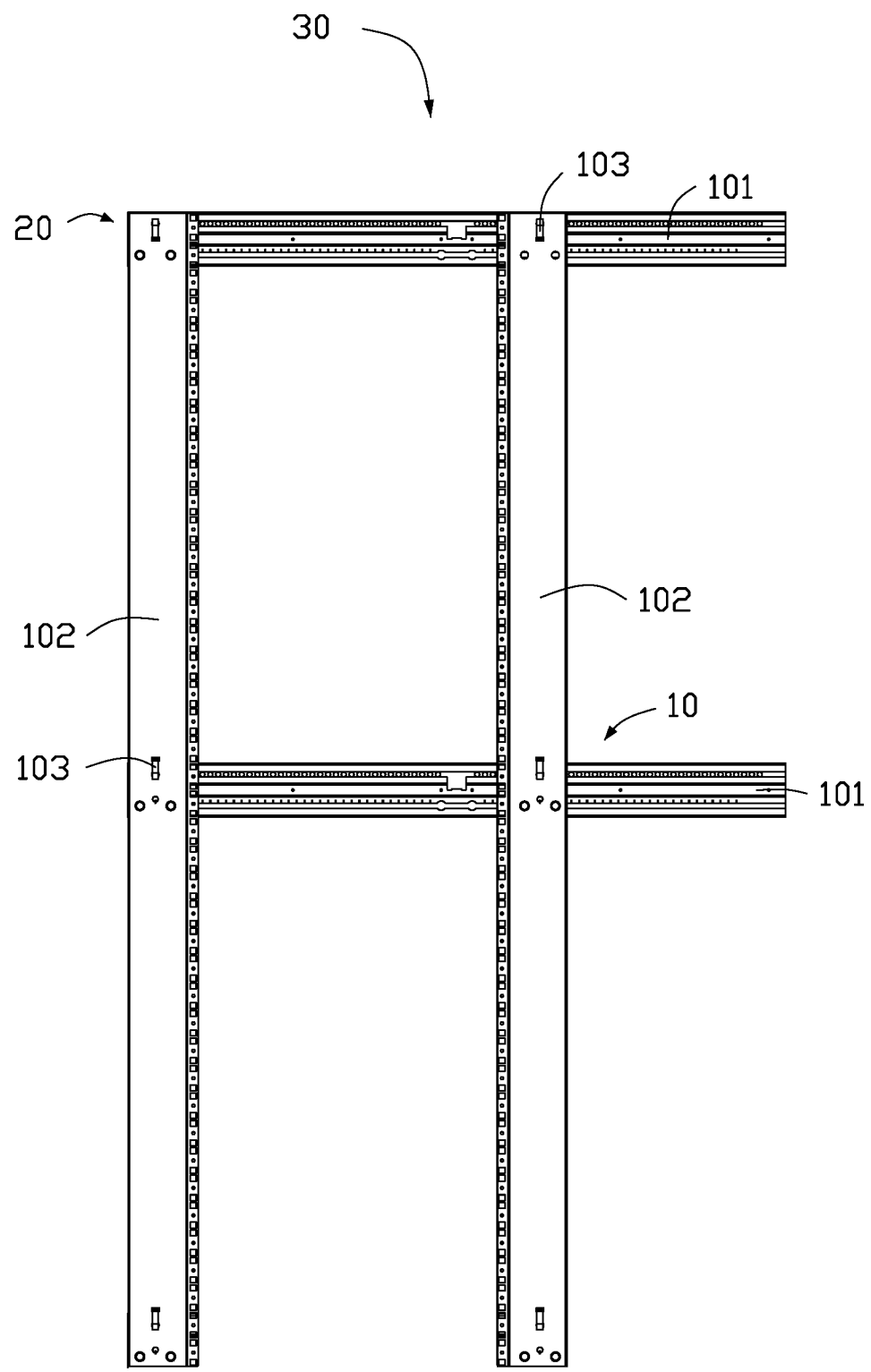
FIG. 8 is a perspective view showing assembly for rapid disassembly, with the structure for mounting servers of FIG. 7 and FIG. 1.

Referring to FIG. 8, the structure for mounting servers 20 and the first structure for mounting servers 10 are assembled together to form a subassembly for rapid disassembly 30. One top end of the mounting column 102 of the first structure for mounting servers 10 is connected to the cross beam 101 of the second structure for mounting servers 20 by the fastening subassembly 103. One top end of the cross beam 101 of the first structure for mounting servers 10 is connected to the mounting column 102 of the structure for mounting servers 20 by the fastening subassembly 103.

Figure 9:
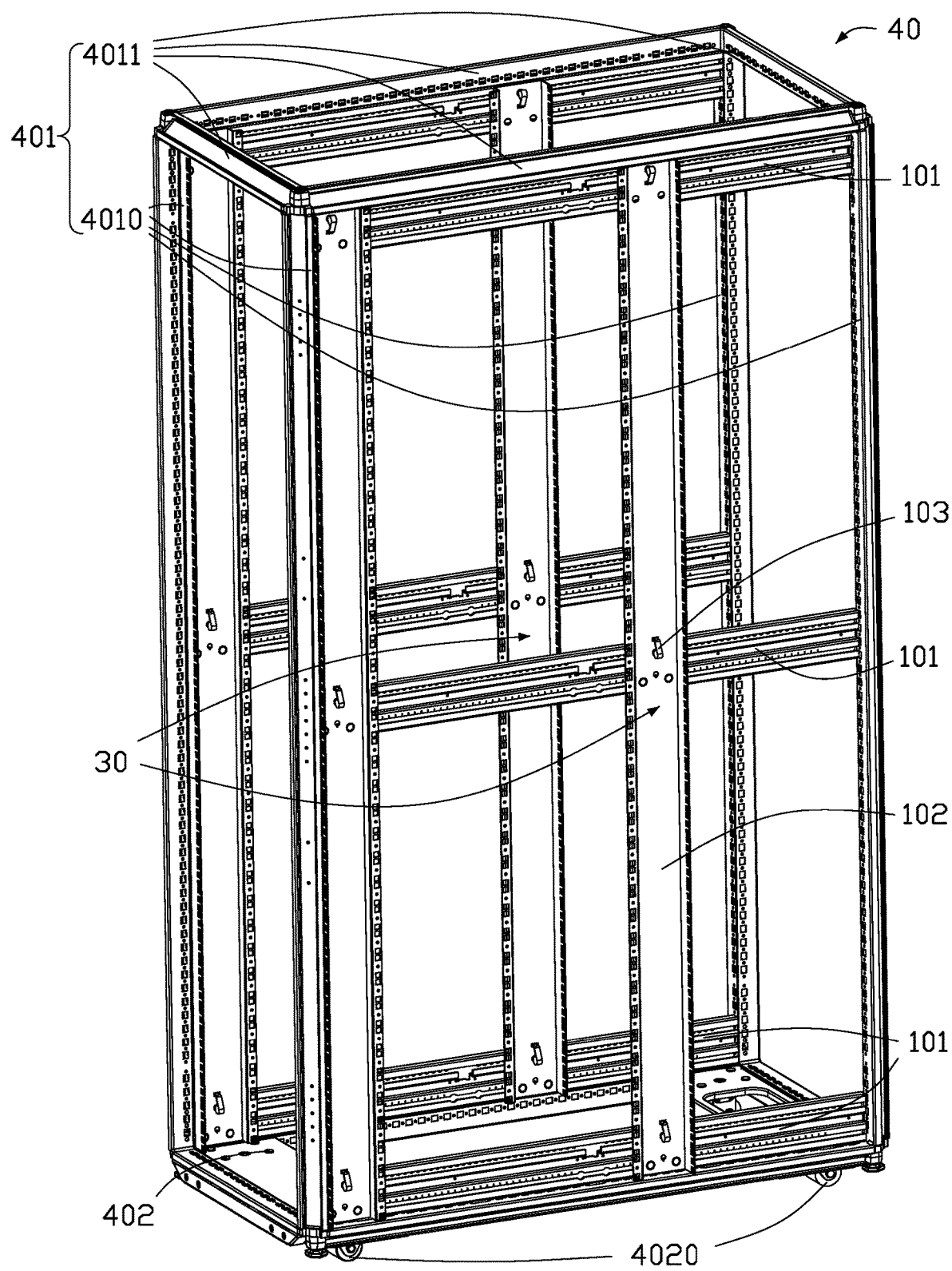
FIG. 9 is a perspective view of a server cabinet, with the structure for mounting servers of FIG. 7 and FIG. 1.

FIG. 9 shows a server cabinet 40, the server cabinet 40 can receive different sizes of servers (not shown). The server cabinet 40 includes a frame 401, a base 402, and two subassemblies for rapid disassembly 30. The two subassemblies for rapid disassembly 30 are opposite to each other. The frame 401 is mounted on the base 402. The servers are fixed in the server cabinet 40 by the mounting columns 102 of the two subassemblies for rapid disassembly 30.

The frame 401 includes four fixing columns 4010 and four fixing strips 4011 connected to the four fixing columns 4010. The four fixing columns 4010 are enclosed and form a cuboid. Top ends of the four fixing columns 4010 are connected to each other by the four fixing strips 4011.

The two subassemblies for rapid disassembly 30 are mounted on the frame 401 by the fastening subassemblies 103. The mounting column 102 of the first structure for mounting servers 10 is connected to the cross beam 101 of the second structure for mounting servers 20 by the fastening subassembly 103 and the cross beam 101 of the first structure for mounting servers 10 is connected to the mounting column 102 of the second structure for mounting servers 20. Each cross beam 101 is fixed on two of the four fixing columns 4010.

A plurality of casters 4020 is installed on the mounting base 402. The plurality of casters 4020 and the frame 401 are on opposite surfaces of the mounting base 402, the plurality of casters 4020 facilitates moving the server cabinet 40.

With the embodiments described above, the guide rail 104 and the fastening subassemblies 103 allow almost infinite positioning of the mounting column 102 along the cross beam 101, so a distance between the mounting columns 102 can be adjusted to adapt to different sizes of servers. Further, the server cabinet 40 is made of subassemblies for rapid disassembly 30, each of the subassemblies for rapid disassembly 30 includes a standing structure 10 and a standing structure 20, and the standing structures 10 and 20 can be assembled and disassembled easily.

The embodiments shown and described above are only examples. Many details are often found in the art such as the other features of a structure for mounting servers, an assembly for rapid disassembly, and a server cabinet with the subassembly for rapid disassembly. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A structure for mounting servers comprising:
   at least one cross beam; wherein a guide rail is fixed on each of the cross beam and extends along the cross beam, a first space is formed by the guide rail and the cross beam;
   at least one mounting column;
   at least one fastening subassembly; wherein the mounting column is perpendicularly connected to the cross beam by the fastening subassembly, the fastening subassembly is fixed on the mounting column and is capable of moving on the cross beam; the fastening subassembly comprises a first fastener; the first fastener comprises a thumb screw and an extrusion subassembly; the extrusion subassembly is located in the first space and capable of moving back and forth along the cross beam in the first space; the thumb screw passes through the mounting column, enters into the first space, and matches with the extrusion subassembly to tighten the cross beam and the mounting column, wherein a second space is formed by the guide rail and the cross beam, the first space and the second space are "C"-shaped and separated by the guide rail, the fastening subassembly further comprises a second fastener, the second fastener comprises a guide subassembly, one end of the guide subassembly is fixed on the mounting column, and the other one end of the guide subassembly extends out to form a cap-like protrusion, the cap-like protrusion enters into the second space, and the mounting column can be moved back and forth along the cross beam by the guide subassembly.

2. The structure for mounting servers of claim 1, wherein first import and exports are formed in the second space, and a second import and export is formed in the first space; the cap-like protrusion enters into the second space by the first import and export, the extrusion subassembly enters into the first space by the second import and export.

3. A subassembly for rapid disassembly comprising:
   a first structure for mounting servers; and
   a second structure for mounting servers; the first structure and the second structure each comprising:
      at least one cross beam; wherein a guide rail is fixed on each of the cross beam and extends along the cross beam, a first space is formed by the guide rail and the cross beam;
      at least one mounting column;
      at least one fastening subassembly; wherein the mounting column is perpendicularly connected to the cross beam by the fastening subassembly, the fastening subassembly is fixed on the mounting column and is capable of moving on the cross beam; the fastening subassembly comprises a first fastener; the first fastener comprises a thumb screw and an extrusion subassembly; the extrusion subassembly is located in the first space and can be moved back and forth along the cross beam in the first space; the thumb screw passes through the mounting column, enters into the first space, and matches with the extrusion subassembly to tighten the cross beam and the mounting column; and
   wherein the mounting column of the first structure is connected to the cross beam of the first structure by the fastening subassembly, one end of the mounting column of the second structure is connected to one end of the cross beam of the second structure by the fastening subassembly; the mounting column of the first structure is connected to the cross beam of the second structure for mounting servers by the fastening subassembly and the cross beam of the first structure for mounting servers is connected to the mounting column of the second structure for mounting servers to form the subassembly for rapid disassembly, wherein a second space is formed by the guide rail and the cross beam, the first space and the second space are "C"-shaped and separated by the guide rail, the fastening subassembly further comprises a second fastener, the second fastener comprises a guide subassembly, one end of the guide subassembly is fixed on the mounting column, and the other one end of the guide subassembly extends outward to form a cap-like protrusion, the cap-like protrusion enters into the second space, and the mounting column can be moved back and forth along the cross beam by the guide subassembly.

4. The subassembly for rapid disassembly of claim 3, wherein first import and exports are formed in the second space, and a second import and export is formed in the first space; the cap-like protrusion enters into the second space by the first import and export, the extrusion subassembly enters into the first space by the second import and export.

5. A server cabinet comprising:
   two opposite subassemblies for rapid disassembly, each of the subassemblies for rapid disassembly comprising:
      a first structure for mounting servers; and
      a second structure for mounting servers; the first structure and the second structure each comprising:
         at least one cross beam; wherein a guide rail is fixed on each of the cross beam and extends along the cross beam, a first space is formed by the guide rail and the cross beam;
         at least one mounting column;
         at least one fastening subassembly; wherein the mounting column is perpendicularly connected to the cross beam by the fastening subassembly, the fastening subassembly is fixed on the mounting column and is capable of moving on the cross beam; each of the fastening subassembly comprises a first fastener; the first fastener comprises a thumb screw and an extrusion subassembly; the extrusion subassembly is located in the first space and can be moved back and forth along the cross beam in the first space; the thumb screw passes through the mounting column, enters into the first space, and matches with the extrusion subassembly to tighten the cross beam and the mounting column; and
      wherein the mounting column of the first structure is connected to the cross beam of the first structure by the fastening subassembly, one end of the mounting column of the second structure is connected to one end of the cross beam of the second structure by the fastening subassembly; the second structure for mounting servers is connected to the first structure for mounting servers to form the subassembly for rapid disassembly, wherein the server cabinet further comprises a frame, and a mounting base, the frame is mounted on the mounting bass; the frame comprises four fixing columns and four fixing strips, top ends of the four fixing columns are connected to each other by the four fixing strips, the subassemblies for rapid disassembly are mounted on the frame by the fastening subassemblies, each cross beam is fixed on two of the four fixing columns, wherein a second space is formed by the guide rail and the cross beam, the first space and the second space are "C"-shaped and separated by the guide rail, the fastening subassembly further comprises a second fastener, the first fastener comprises a guide subassembly, one end of the guide subassembly is fixed on the mounting column, and the other one end of the guide subassembly extends outward to form a cap-like protrusion, the cap-like protrusion enters into the second space, and the mounting column can be moved back and forth along the cross beam by the guide subassembly.

6. The structure for mounting servers of claim 1, wherein the cross beam comprises two side edges and a cross beam bottom, each of the two side edges comprises a first side edge portion perpendicularly connected to the cross beam bottom and a second side edge portion perpendicularly extending from the first side edge portion, the second side edge portions of the two side edges extend face to face, the guide rail comprises two side walls and a rail bottom, each of the two side walls comprises a first side wall portion perpendicularly connected to the rail bottom and a second side wall portion perpendicularly extending out from the first side wall portion, the second side wall portions extend in opposite directions, the first space is formed by one of the two side edges, the cross beam bottom, and one of the two side walls, the second space is formed by the other one of the two side edges, the cross beam bottom, and the other one of the two side walls.

7. The structure for mounting servers of claim 1, wherein the second side edge portion is between the extrusion subassembly and the mounting column.

8. The structure for mounting servers of claim 3, wherein the cross beam comprises two side edges and a cross beam bottom, each of the two side edges comprises a first side edge portion perpendicularly connected to the cross beam bottom and a second side edge portion perpendicularly extending from the first side edge portion, the second side edge portions of the two side edges extend face to face, the guide rail comprises two side walls and a rail bottom, each of the two side walls comprises a first side wall portion perpendicularly connected to the rail bottom and a second side wall portion perpendicularly extending out from the first side wall portion, the second side wall portions extend in opposite directions, the first space is formed by one of the two side edges, the cross beam bottom, and one of the two side walls, the second space is formed by the other one of the two side edges, the cross beam bottom, and the other one of the two side walls.

9. The structure for mounting servers of claim 3, wherein the second side edge portion is between the extrusion subassembly and the mounting column.

10. The structure for mounting servers of claim 5, wherein the cross beam comprises two side edges and a cross beam bottom, each of the two side edges comprises a first side edge portion perpendicularly connected to the cross beam bottom and a second side edge portion perpendicularly extending from the first side edge portion, the second side edge portions of the two side edges extend face to face, the guide rail comprises two side walls and a rail bottom, each of the two side walls comprises a first side wall portion perpendicularly connected to the rail bottom and a second side wall portion perpendicularly extending out from the first side wall portion, the second side wall portions extend in opposite directions, the first space is formed by one of the two side edges, the cross beam bottom, and one of the two side walls, the second space is formed by the other one of the two side edges, the cross beam bottom, and the other one of the two side walls.

11. The structure for mounting servers of claim 5, wherein the second side edge portion is between the extrusion subassembly and the mounting column.

* * * * *